(12) United States Patent
Bonenfant et al.

(10) Patent No.: US 12,156,362 B2
(45) Date of Patent: *Nov. 26, 2024

(54) SYSTEM COMPRISING A RACK, WITH SUPPORT MEMBERS AND COMPONENTS INSERTABLE IN THE RACK AND CONNECTABLE VIA LIQUID CONNECTORS

(71) Applicant: OVH, Roubaix (FR)

(72) Inventors: Jules Hermann Bonenfant, Lys lez Lannoy (FR); Valentin Cartigny, Mons-en-Baroeul (FR)

(73) Assignee: OVH, Roubaix (FR)

( * ) Notice: Subject to any disclaimer, the term of this patent is extended or adjusted under 35 U.S.C. 154(b) by 107 days.

This patent is subject to a terminal disclaimer.

(21) Appl. No.: 17/749,451

(22) Filed: May 20, 2022

(65) Prior Publication Data

US 2022/0386496 A1 Dec. 1, 2022

(30) Foreign Application Priority Data

May 27, 2021 (EP) .................................... 21305705

(51) Int. Cl.
 *H05K 7/14* (2006.01)
 *H05K 7/20* (2006.01)

(52) U.S. Cl.
 CPC ....... *H05K 7/1487* (2013.01); *H05K 7/20272* (2013.01); *H05K 7/20772* (2013.01)

(58) Field of Classification Search
 CPC .. H01R 13/631; H05K 7/1452; H05K 7/1487; H05K 7/1489; H05K 7/20272;

(Continued)

(56) References Cited

U.S. PATENT DOCUMENTS

| 5,297,009 A * | 3/1994 | Gelez ............... H05K 7/1411 |
| | | 211/41.17 |
| 2002/0067601 A1* | 6/2002 | Hsu .................... H05K 7/1425 |
| | | 361/752 |

(Continued)

OTHER PUBLICATIONS

Extended European Search Report with regard to the EP Patent Application No. 21305705.2 completed Nov. 19, 2021.

(Continued)

*Primary Examiner* — Jacob R Crum
(74) *Attorney, Agent, or Firm* — BCF LLP

(57) ABSTRACT

A system comprises a rack, a support member, and a component configured for being supported in the rack by the support member. The support member is selectively insertable in the rack and comprises a plate at its rear end, the plate extending at an angle from a direction of insertion of the support member in the rack, the support member further comprising a first liquid connector mounted to the plate. The component comprises a second liquid connector mounted on a rear edge of the component, the second liquid connector being connectable to the first liquid connector when the support member and the component are inserted in the rack. A method comprises mounting the first and second liquid connectors to the support member and to the component, respectively, inserting the support member to the rack, and inserting the component in the rack until both liquid connectors are connected.

20 Claims, 15 Drawing Sheets

(58) Field of Classification Search
CPC ........... H05K 7/20772; H05K 7/20781; H05K 7/20818
See application file for complete search history.

(56) References Cited

U.S. PATENT DOCUMENTS

| | | | | |
|---|---|---|---|---|
| 2002/0179549 | A1* | 12/2002 | Felcman | H05K 7/1494 |
| | | | | 211/151 |
| 2005/0270751 | A1* | 12/2005 | Coglitore | G06F 1/183 |
| | | | | 312/223.3 |
| 2015/0362691 | A1* | 12/2015 | Montgelas | F16L 3/01 |
| | | | | 29/428 |
| 2016/0066480 | A1 | 3/2016 | Eckberg et al. | |
| 2016/0381834 | A1* | 12/2016 | Harvilchuck | F16L 37/32 |
| | | | | 285/91 |
| 2018/0014433 | A1* | 1/2018 | Klein | H01L 35/28 |
| 2020/0100392 | A1 | 3/2020 | Iyengar et al. | |
| 2020/0178413 | A1 | 6/2020 | Thibaut et al. | |
| 2020/0278227 | A1 | 9/2020 | Thibaut et al. | |

OTHER PUBLICATIONS

EP Communication with regard to the counterpart EP Patent Application No. 21305705.2 dated Apr. 4, 2023.

* cited by examiner

SYSTEM COMPRISING A RACK, WITH SUPPORT MEMBERS AND COMPONENTS INSERTABLE IN THE RACK AND CONNECTABLE VIA LIQUID CONNECTORS

CROSS-REFERENCE

The present application claims priority from European Patent Application No. 21305705.2, filed on May 27, 2021, the entirety of which is incorporated by reference herein.

FIELD

The present technology relates to enclosures adapted to receive and provide fluid cooling to electronic equipment. In particular, a system comprising a rack, with support members and components insertable in the rack and connectable via liquid connectors is disclosed.

BACKGROUND

Electronic components, for example servers, memory banks, computer discs, and the like, are conventionally mounted one above the other in equipment racks.

Large data centers that may contain thousands or even tens of thousands of servers and other heat-generating components hosted in equipment racks. Liquid cooling techniques have been proposed for providing cooling to those components by using a heat-transfer fluid brought in thermal connection with the heat-generating components such that thermal energy generated therefrom may be collected by the heat-transfer fluid and brought elsewhere. For example, U.S. Patent Application Publication No. 2020/0178413 to Thibaut et al., published on Jun. 4, 2020, the disclosure of which is incorporated by reference herein, introduces techniques for connecting a liquid adaptor mounted on a component, such as a server, to another liquid adaptor mounted in the backplane of an equipment rack. It has been observed that a weight of the components inserted in the equipment rack may lead to mechanical deformation of parts supporting the components and to misalignment between the liquid adaptors mounted in the components and in the backplane of the equipment rack. Consequently, providing a fluid connection between the electronic devices and the heat-transfer fluid facility is a delicate and cumbersome operation.

Improvements are still desirable in the maintenance and provisioning of large data centers.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) difficulties in ensuring proper alignment of components in equipment racks and/or (2) lack of efficient methods of providing water-cooling to components mounted in equipment racks.

In one aspect, various implementations of the present technology provide a system, comprising a rack; a support member configured to be selectively inserted in the rack, the support member comprising an elongate plate extending in a direction of insertion of the support member in the rack from a front end to a rear end of the support member, and a plate at its rear end, the plate extending perpendicularly from the elongate plate, the support member further comprising a first liquid connector mounted to the plate; and a component configured for being supported in the rack by the support member. The component comprises a second liquid connector mounted on a rear edge of the component, the second liquid connector being configured for connecting to the first liquid connector when the support member and the component are inserted in the rack.

In some implementations of the present technology, the first liquid connector comprises a feed port and a return port mounted on the plate; the second liquid connector comprises an inlet port and an outlet port; the inlet port is adapted for mating with the feed port when the first and second liquid connectors are connected; and the outlet port is adapted for mating with the return port when the first and second liquid connectors are connected.

In some implementations of the present technology, the system further comprises a feed tube connected to the feed port; and a return tube connected to the return port. The feed tube and the return tube extend behind the plate of the support member for providing liquid cooling to the component.

In some implementations of the present technology, the system further comprises an inlet tube mounted to the inlet port; and an outlet tube mounted to the outlet port. The inlet tube and the outlet tube are mounted on the component for distributing liquid cooling to a heat-generating unit of the component.

In some implementations of the present technology, a slot is formed on the plate; and the component comprises a rod having lateral extensions on an end section protruding beyond the rear edge of the component, the rod being rotatable for aligning the lateral extensions with the slot upon mounting the component in the rack, for allowing insertion of the end section in the slot and for subsequently placing the lateral extensions out of alignment with the slot to cause the lateral extensions to abut on a face of the plate opposite from the component for maintaining a connection of the first and second liquid connectors.

In some implementations of the present technology, the slot is formed between the feed port and the return port.

In some implementations of the present technology, a center of the feed port, a center of the return port and a center of the slot form a triangle.

In some implementations of the present technology, the rod extends to a front edge of the component.

In some implementations of the present technology, the first liquid connector is a male liquid connector and the second liquid connector is a female liquid connector.

In some implementations of the present technology, the first liquid connector is a female liquid connector and the second liquid connector is a male liquid connector.

In some implementations of the present technology, the rack comprises two opposite mounting panels; the support member is a first support member configured for mounting on one of the mounting panels; the system further comprises a second support member configured for mounting on another one of the mounting panels; and the component is configured for being supported in the rack by the two mounting panels.

In some implementations of the present technology, each mounting panel comprises a plurality of rack mounting features distributed along a same horizontal axis, corresponding rack mounting features being disposed at corresponding heights on the two mounting panels; and the first and second support members each comprise a plurality of connector legs configured for connecting to corresponding ones of the rack mounting features when the first and second support members are inserted in the rack.

In some implementations of the present technology, the support member further comprises a tab positioned on its front end, the tab being adapted for being folded against the rack for locking a position of the support member when mounted in the rack.

In some implementations of the present technology, the rack defines a plurality of parallel stages, each respective stage being adapted for receiving a respective support member and a respective component.

In some implementations of the present technology, a spacing between each of the plurality of parallel stages corresponds to a standard-size rack unit.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
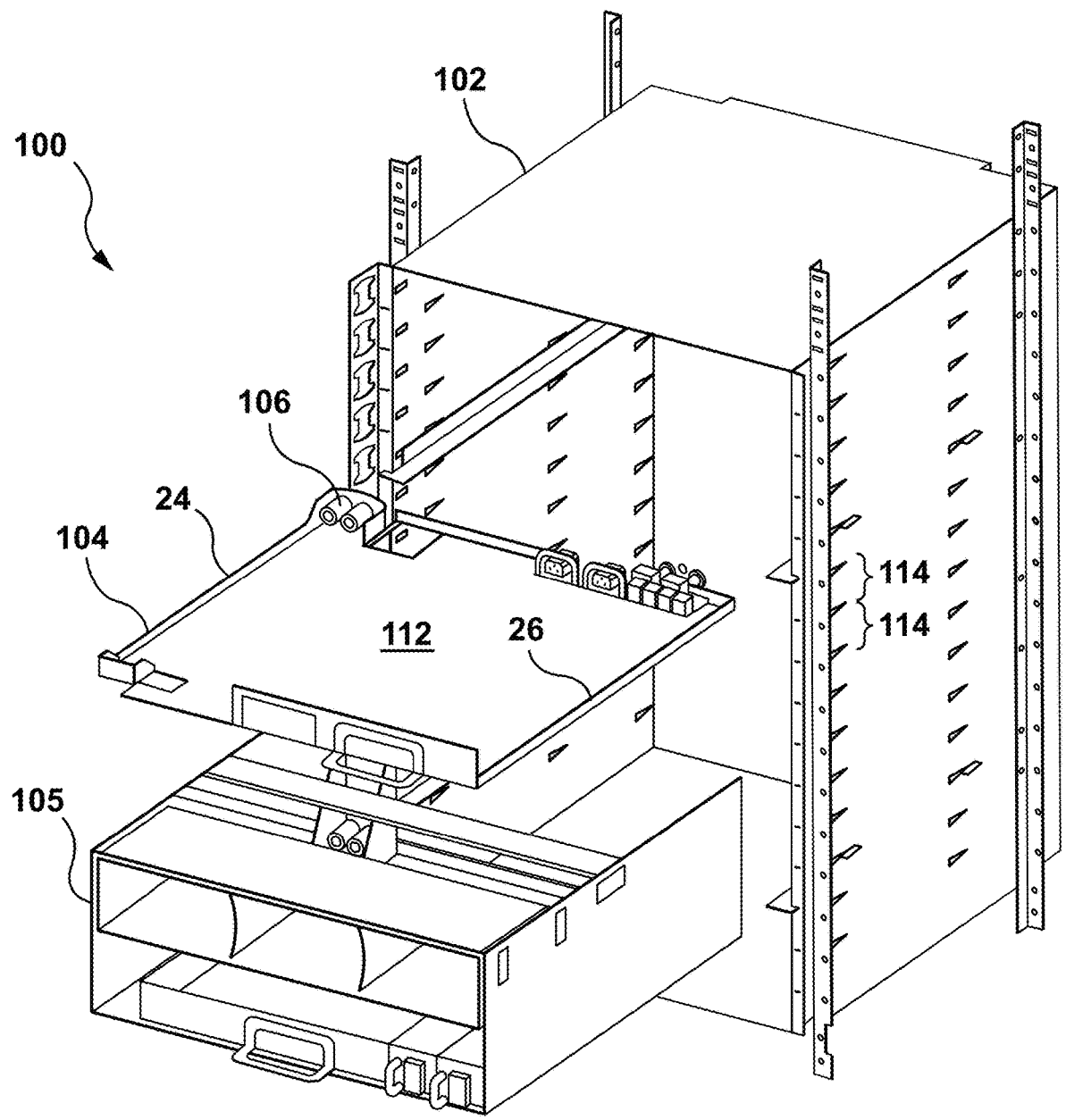
FIG. 1 is a front perspective view of a system comprising a rack in which support members are inserted and at least one insertable component in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in computer-readable media and so executed by a computer or processor, whether or not such computer or processor is explicitly shown.

With these fundamentals in place, we will now consider some non-limiting examples to illustrate various implementations of aspects of the present technology.

The present technology allows to efficiently mount equipment in a rack, including without limitation servers, data storage solutions, and the like, including fluidic connections for the provision of liquid cooling.

In the present specification, the term rack should be understood as synonymous with enclosure, chassis, cabinet and similar terms. The term system may encompass a combination of elements, including without limitation a rack and a component inserted in the rack.

Rack 102

Referring now to the drawings, FIG. 1 is a front perspective view of a system 100 comprising a rack 102 and at least one insertable component 104. The rack 102 may for example be a 19-inch, standard-size rack having dimensions as defined in the EIA/ECA-310-E "Cabinets, Racks, Panels, And Associated Equipment" standard published by The Electronic Components Sector Of The Electronic Industries Alliance, December 2005.

In the present description of the rack 102, the component 104 are introduced at the front of the rack 102; and left and right sides of the rack 102, of the component 104, and of their various parts are defined from the perspective of a viewer positioned in front of the rack 102. Also, while a rack may be configured for vertical insertion of components, the present disclosure describes a configuration in which the components 104 are insertable in a horizontal configuration within the rack 102. These considerations are made for simplification purposes and for a better understanding of terms such as 'horizontal', 'vertical', 'front', 'rear', 'left' and 'right', without limiting the generality of the present disclosure.

The component 104 includes a liquid connector adapted for mating with a liquid connector mounted on a support member 18 (FIG. 2) mountable on the rack 102. In an embodiment, the liquid connectors mounted on the support member 18 and on the component 104 may comprise conventional quick-connect fluidic adaptors that may come in contact and mate when the support member 18 and the component 104 are both fully inserted in the rack 102. Particular embodiments of the liquid connectors will be described in greater details herein further below. The component 104 also includes a main board 112 on which some heat-generating units 900 (FIG. 9) may be mounted. The liquid connectors may be configured for providing liquid cooling to said heat-generating units 900. In an embodiment, the rack 102 may be a server rack and the insertable component 104 housed thereby may be a server module or a related functional module (e.g., networking, hard-disk drives, or power supply module).

Figure 2:
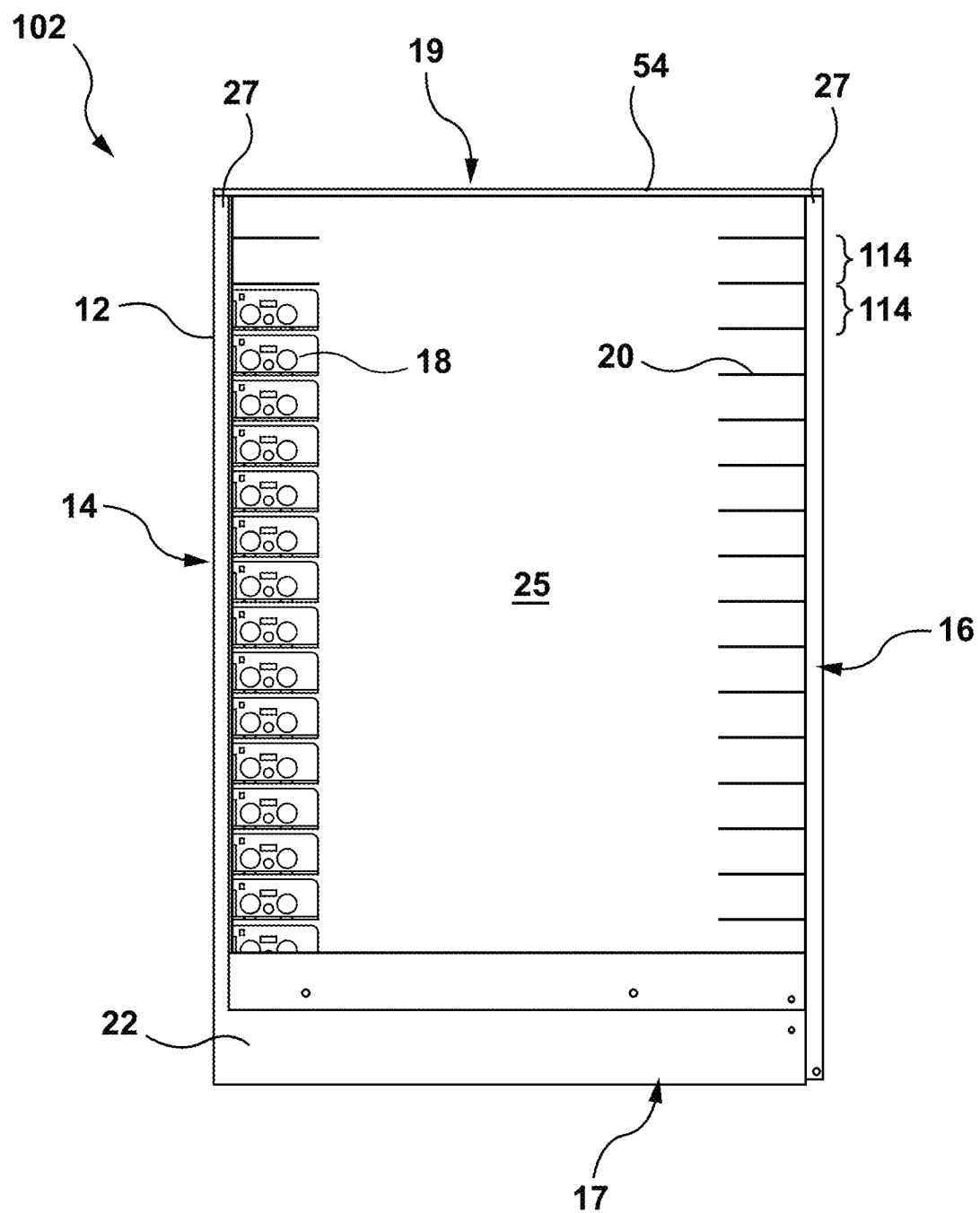
FIG. 2 is a front elevation view of the rack of FIG. 1 in accordance with an embodiment of the present technology.

FIG. 2 is front elevation view of the rack 102 in which support members 18 are inserted. Referring at once to FIGS. 1 and 2, the rack 102 has a left lateral end 14 and a right lateral end 16 which are opposite one another in the lateral direction. As can be seen, in this embodiment, the rack 102 has a width, measured between the lateral ends 14, 16, that is less than a height thereof, measured between a lower end 17 and an upper end 19 of the rack 102. As such, the rack 102 can be said to be vertically-extending rather than vertically-extending. It is contemplated that the rack 102 could be horizontally-extending in other embodiments.

A frame 12 of the rack 102 has a base 22 defining a bottom portion of the rack 102. In this embodiment, the frame 12 has a plurality of generally rectangular vertical walls fastened to the base 22 and extending upwardly therefrom. The vertical walls are mounting panels 27 for supporting the support members 18 and the components 104. An upper frame member 54 extends parallel to the base 22 and defines at least in part the upper end 19 of the rack 102. Notably, the upper frame member 54 is a generally planar sheet metal component that is fastened to the upper ends of the mounting panels 27. Two or more of the mounting panels 27 are laterally spaced from one another so as to define one or more housing sections 25 therebetween in which the at least one insertable component 104 can be housed. In the embodiment of FIGS. 1 and 2, the frame 12 includes two mounting panels 27 which define one housing section 25. The rack 102 may define one or more housing sections 25 in alternative embodiments (e.g., three housing sections 25 in some embodiments). For simplification purposes and without limiting the generality of the present disclosure, the remainder of the description will describe a single housing section 25 defined by two mounting panels 27.

The rack 102 comprises left and right support members 18 and 20 that mechanically guide an initial alignment of the component 104 upon initial insertion of the component 104 in the rack 102 and support the component 104 within the housing section 25. As will be described in greater detail below, each mounting panel 27 defines a plurality of mounts onto which the left and right support members 18 and 20 can be mounted. Each left support member 18 correspond to one of the right support members 20, thereby forming pairs of support member 18, 20, the left and right support members 18, 20 of a pair being horizontally aligned when mounted in the rack 102. In this embodiment, the left and right support members 18, 20 are internal to the rack 102 and adapted to mate with a corresponding side edge 24, 26 of the component 104 that may be inserted in the rack 102. The left and right support members 18, 20 are described in greater details herein below.

The rack 102 comprises a plurality of vertically distributed, parallel rack stages 114. Each rack stage 114 is adapted to receive a distinct component such as the component 104. The main board 112 may be a standard-size board, for example a 19-inch board. Each rack stage 114, or position, may occupy a standard-size rack unit "U" defined in the vertical direction. A height of the shown component 104 is adapted to fit in a single rack stage, the height of the component 104 not exceeding the unit U. Each rack stage 114 is adapted to receive a distinct component when each of those components has a height that does not exceed the rack unit U. Another component 105 occupies a plurality rack stages 114 when inserted in the rack 102, as best shown in FIG. 1.

Mounting Panel 27

Figure 3:
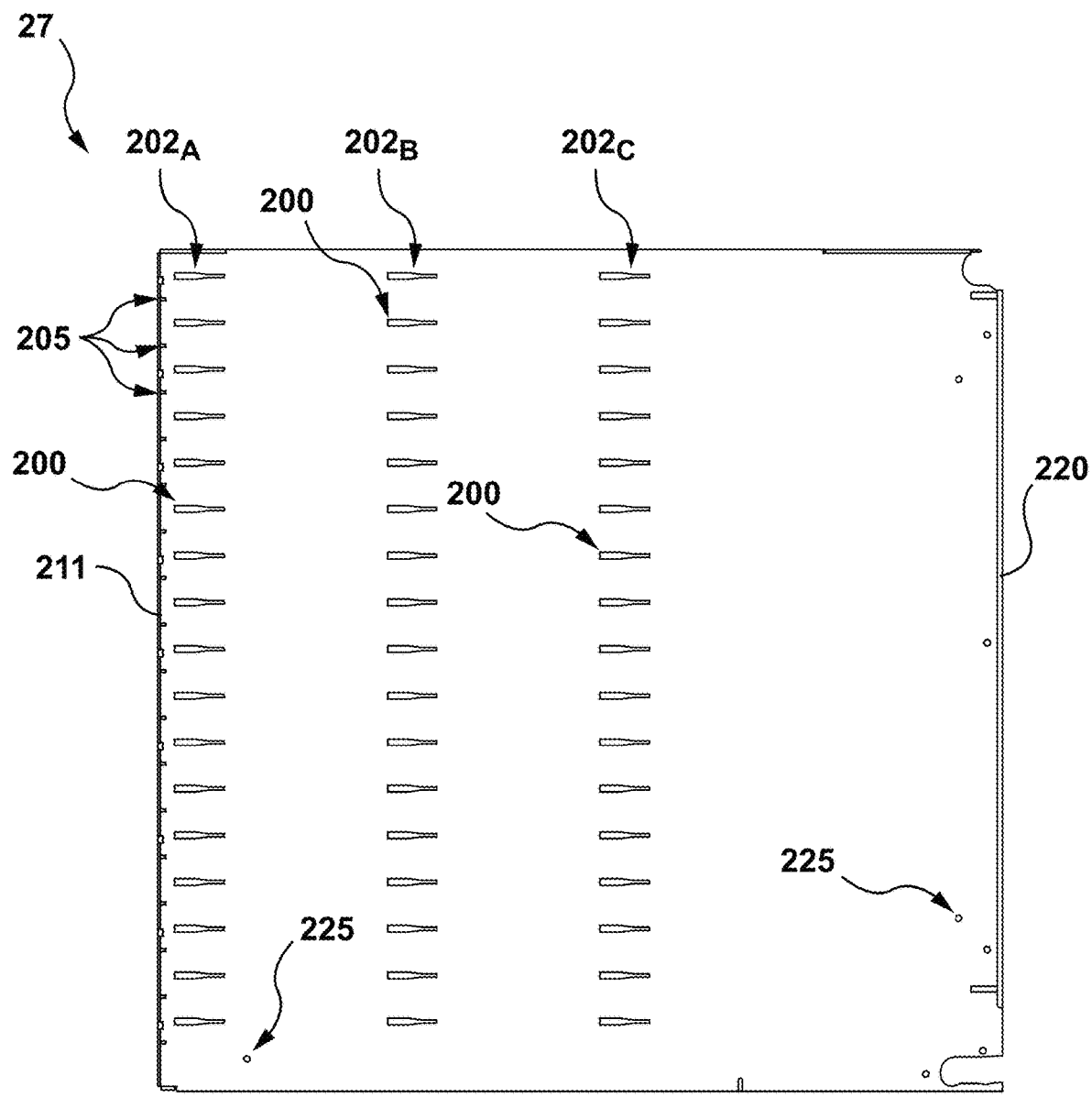
FIG. 3 is a right side elevation view of a left mounting panel of the electronic equipment rack of FIG. 1 in accordance with an embodiment of the present technology.
Figure 7:
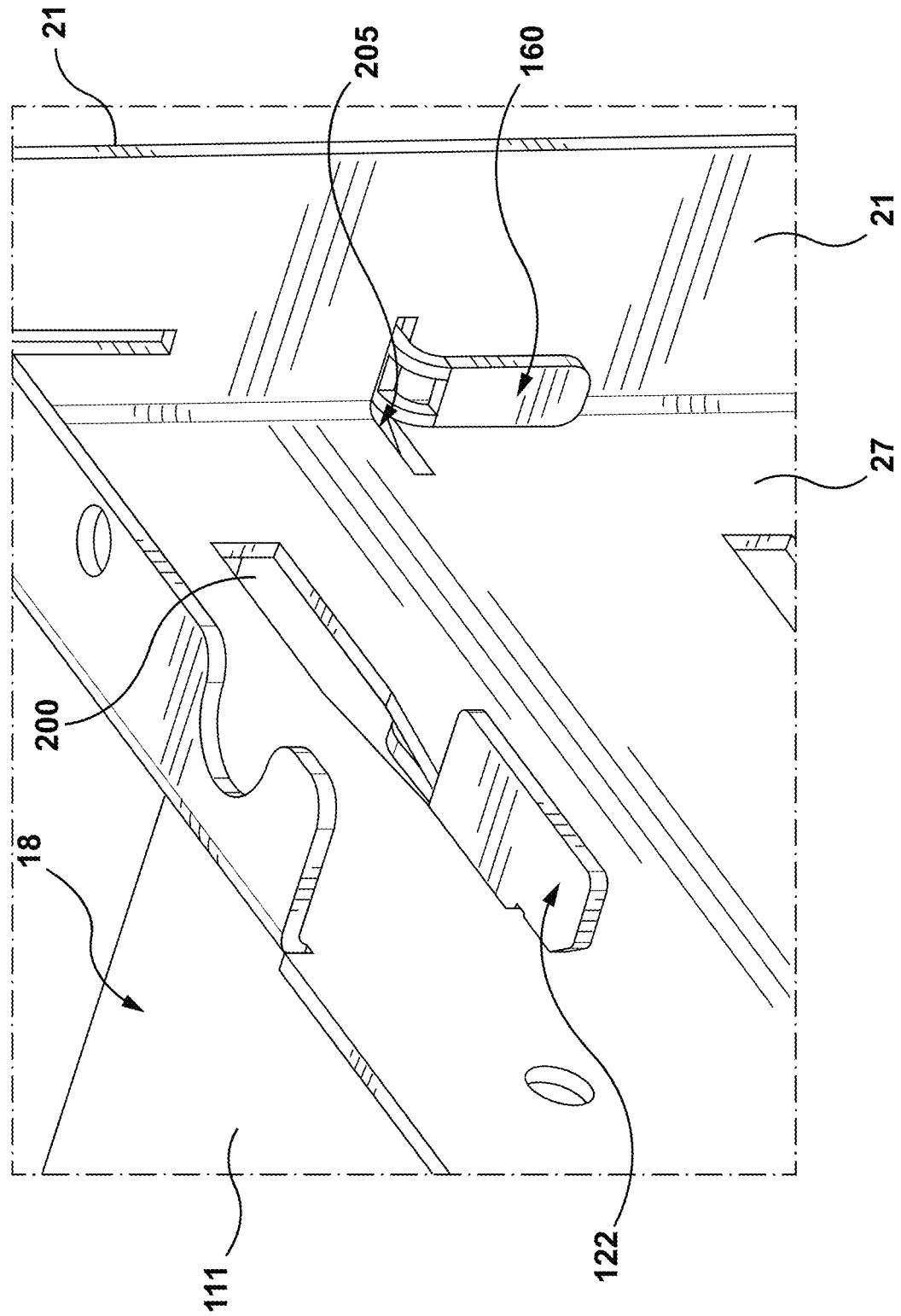
FIG. 7 is a perspective view, taken from a top, rear, left side, of the left mounting panel of FIG. 3 with the left support member of FIG. 5 connected thereto in accordance with an embodiment of the present technology.

FIG. 3 illustrates one of the mounting panels 27, namely a left mounting panel 27 defining a left side of one of the housing sections 25, the left mounting panel 27 being viewed from inside the housing section 25. The mounting panel 27 extends along a depth of the rack 102 from a front end 211 to a rear end 220. In this embodiment, as best shown in FIG. 7, the front end 211 of the mounting panel 27 comprises a vertically-extending front portion 221 extending perpendicularly to the mounting panel 27. Right mounting panels 27 defining the right sides of the housing sections 25 are a mirror image of the left mounting panel 27 of FIG. 3. Therefore, only the left mounting panel 27 will be described in detail herein. It is to be understood that the same description applies to the right mounting panel 27.

The mounting panel 27 has a plurality of rack mounting features for mounting the left support members 18 to the rack 102. The mounting panel 27 also defines, at each rack stage 114, an opening 205 extending though a portion of the vertically-extending front portion 221 for receiving a tab 160 (FIGS. 5 and 7) of a corresponding left support member 18. The mounting panel 27 also defines fastener openings 225 distributed over the mounting panel 27 through which fasteners (e.g., bolts) may be inserted to connect the mounting panel 27 to another one of the mounting panels 27 of the rack 102. For example, the left mounting panel 27 illustrated on FIG. 3 may be connected to a right mounting panel of an adjacent housing section 25 of the rack 102.

In this embodiment, the rack mounting features are apertures 200 formed on the mounting panel 27. The apertures 200 are distributed in three distinct columns $202_A$, $202_B$, $202_C$ of apertures 200 that are spaced from one another in the depth direction of the rack 102. Apertures 200 of a given rack stage 114 are disposed along a common horizontal axis, so that one aperture 200 of each of the front, middle and rear columns $202_A$, $202_B$ and $202_C$ define a set of apertures 200 for receiving a support member 18 or 20 in the given rack stage 114. The mounting panel 27 may comprise additional rows and/or columns of apertures 200 in other embodiments.

Apertures 200

Figure 4:
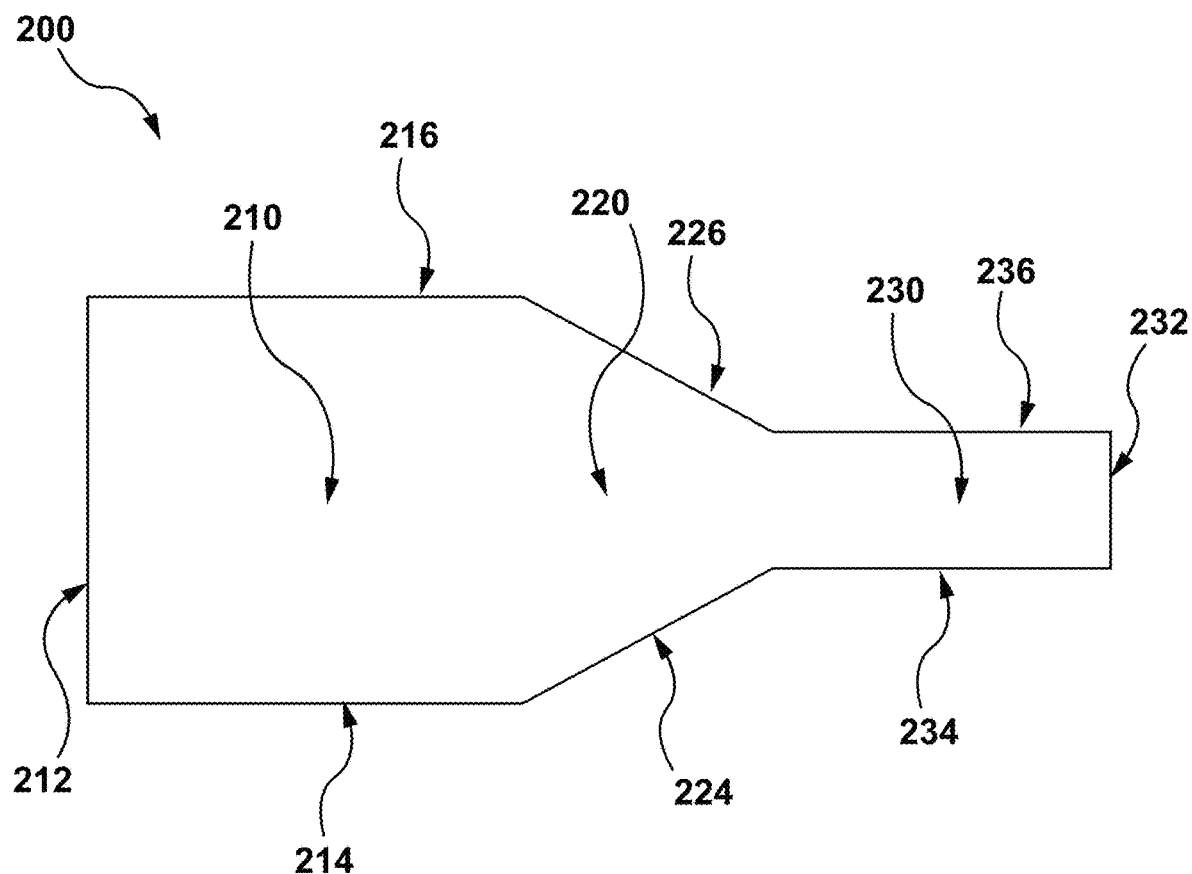
FIG. 4 is a right side elevation view of a rack mounting feature of the left mounting panel of FIG. 3 in accordance with an embodiment of the present technology.

As shown in FIG. 4, in this embodiment, each aperture 200 extends from a front end 212 to a rear end 232. The aperture 200 has an enlarged portion 210, a reduced portion 230 and a transition portion 220 extending between the enlarged and reduced portions 210, 230. The enlarged portion 210 has a first height measured between a lower end 214 and an upper end 216, while the reduced portion 230 has a second height measured between a lower end 234 and an upper end 236. As can be seen, the second height of the reduced portion 230 is less than the first height of the enlarged portion 210. A height of the transition portion 220, measured between a lower end 224 and an upper end 226, decreases along a span thereof in the depth direction of the rack 102 (i.e., from the front to the rear of the aperture 200) from the enlarged portion 210 to the reduced portion 230. FIG. 4 is not to scale; sizes of vertical aspects of the aperture 200 are exaggerated in comparison to sizes of horizontal aspects for illustration purposes.

Since the right mounting panel 27 of a given housing section 25 is a mirror image of the left mounting panel 27, the apertures 200 of the left mounting panel 27 of the given housing section 25 are disposed at a same height as the corresponding apertures 200 of the right mounting panel 27 of the given housing section 25 such that, in use, a given component 104 may be mounted in a given rack stage 114 within the housing section 25 between the left and right mounting panels 27 using two sets of apertures 200.

Left Support Member 18

A left support member 18 will now be described with reference to FIG. 5. The left support member 18 is mountable on the left mounting panel 27 of the rack 102.

In this embodiment, the left support member 18 comprises a horizontally-extending portion 111, or "elongate plate" 111, extending from a front end 113 to a rear end 115 between left and right lateral ends 116, 117. The left support member 18 extends in the depth direction of the rack 102 such that, in use, the front end 113 is located proximate the front end 211 of the mounting panel 27 while the rear end 115 is located proximate the rear end 220 of the mounting panel 27. The left support member 18 also has a vertically-extending portion 118 extending from the left lateral end 116 of the horizontally-extending portion 111 at a right angle and defining an internal side surface $118_1$ and an external side surface $118_2$. In this embodiment, the left support member 18 has three connector legs 122 extending from the vertically-extending portion 118. Each of the connector legs 122 is configured to engage with a respective aperture 200 of the corresponding mounting panel 27 to connect the left support member 18 to the rack 102. In this embodiment, the connector legs 122 extend laterally from a top end 119 of the vertically-extending portion 118 and at a right angle from the vertically-extending portion 118. In other embodiments, the number of connector legs 122 may vary, and the number of apertures 200 may be at least equal to, or greater than, the number of connector legs 122. For example, the support member 18 may include two connector legs 122 for insertion in two of the three apertures 200 of a given rack stage 114. Although distances between columns $202_A$ and $202_B$ and between columns $202_B$ and $202_C$ appear to be equal on FIG. 3, an uneven distribution of the columns on the mounting panel 27 is also contemplated.

The three connector legs 122 of the left support member 18 are configured to engage a set of three apertures 200 of the corresponding mounting panels 27 disposed on a same horizontal axis (i.e., one corresponding aperture 200 of each column $202_A$, $202_B$, $202_C$). In particular, the connector legs 122 of the support member 18 may be inserted in the enlarged portions 210 of the apertures 200 and then slid into the reduced portions 230 of the corresponding apertures 200.

Figure 5:
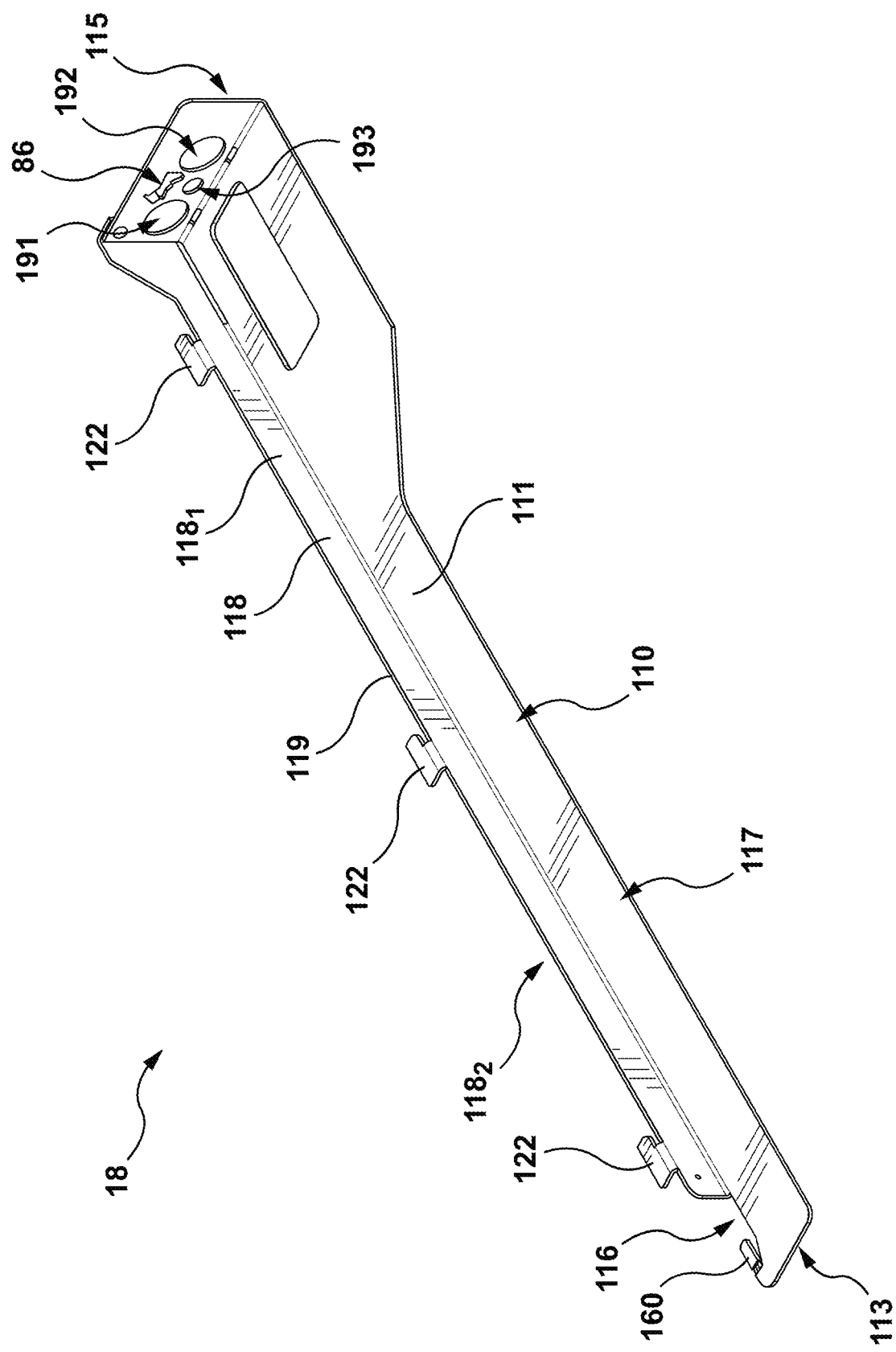
FIG. 5 is a perspective view, taken from a top, front, right side, of a left support member configured to be connected to the left mounting panel of FIG. 3 in accordance with an embodiment of the present technology.

Considering FIGS. 3 and 5, it is contemplated that the set of apertures 200 in a given rack stage 114 could be formed at somewhat different heights on the mounting panel, the vertically-extending portion 118 being formed to place the connector legs 122 of the support member 18 at corresponding vertical positions. For example, the apertures 200 of column $202_B$ could be placed slightly higher or lower than those of columns $202_A$ and $202_C$. As such, the apertures 200 of a given rack stage 114 are horizontally distributed without necessarily being exactly at a same height on the mounting panels 27.

It is also contemplated that the rack 102 may be constructed without the mounting panels 27, to thereby form an open rack. The open rack may therefore have a skeletal structure (not shown) including a plurality of hooks or fasteners (not shown) adapted for attachment of the support members 18 and 20.

Connector Leg 122

Figure 6:
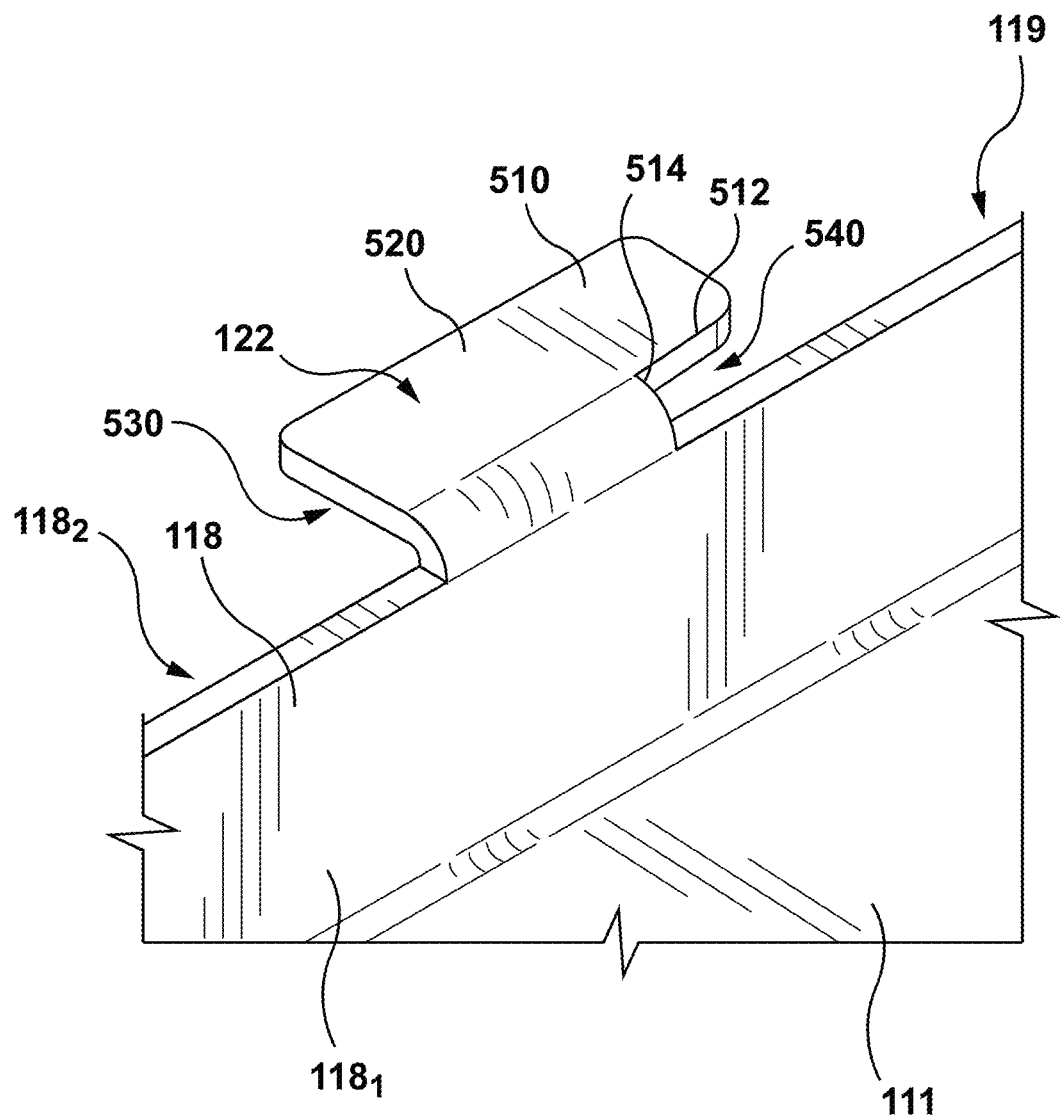
FIG. 6 is a perspective view of a connector leg of the left support member of FIG. 5 in accordance with an embodiment of the present technology.

A connector leg 122 according to a non-limiting embodiment of the present technology will now be described with reference to FIG. 6. In this particular embodiment, all of the connector legs 122 are identical and therefore it is to be understood that the same description applies to all of the connector legs 122 of the left and right support members 18, 20. The connector leg 122 described in FIG. 6 belongs to the left support member 18. Connector legs 122 of the right support member 20 are a mirror image of the connector legs 122 of the left support member 18 of FIG. 6. Therefore, only one the connector legs 122 of the left support member 18 will be described in detail herein. It is to be understood that the same description applies to the connector legs 122 of the right support member 20.

In this embodiment, the connector leg 122 has a hook portion 510 extending rearwardly to allow the connector leg 122 to be hooked onto a corresponding one of the apertures 200 as will be described below. The hook portion 510 is spaced from the external side surface $118_2$ such that an interlocking gap 540 is defined between the external side surface $118_2$ and the hook portion 510. In particular, the interlocking gap 540 is defined by the external side surface $118_2$ and by edges 512, 514 of the connector leg 122, the edges 512, 514 extending at a right angle to one another. The edge 512 is laterally spaced by the interlocking gap 540 from the external side surface $118_2$ and extends substantially parallel thereto.

In order to engage the connector legs 122 with the corresponding apertures 200 of the left mounting panel 27, in this embodiment, the connector legs 122 are inserted into the corresponding apertures 200 and slid along the apertures 200 in the depth direction of the rack 102 to hook the left support member 18 onto the left mounting panel 27. More specifically, for the left support member 18 for instance, each connector leg 122 is inserted in the enlarged portion 210 of the corresponding aperture 200 until the external side surface $118_2$ abuts an inner lateral surface of the mounting panel 27. The larger dimensions of the enlarged portion 210 of the apertures 200 facilitate insertion of the connector legs 122 into the apertures 200. The left support member 18 is then slid rearwardly such that each connector leg 122 slides into the reduced portion 230 of the corresponding aperture 200 until the edge 514 abuts the rear end 232 of the aperture 200. The tapering lower and upper ends 224, 226 (FIG. 4) defining the transition portion 220 of the aperture 200 help guide the connector legs 122 into the reduced portions 230.

When sliding the connector legs 122 along the apertures 200, the left support member 18 slides along the inner lateral surface of the mounting panel 27, and the inner edge 512 of each connector leg 122 slides along an outer lateral surface of the mounting panel 27 (laterally opposed to the inner lateral surface thereof). Part of the mounting panel 27 is thus disposed in the interlocking gap 540 defined by the left support member 18. Once each connector leg 122 is positioned in the reduced portion 230 of the corresponding aperture 200, the lower end 234 and the upper end 236 of the reduced portion 230 come in contact with upper and lower surfaces 520, 530 of the connector leg 122 respectively, in addition to the contact between the edge 514 of the connected leg 122 and the rear end 232 of the aperture 200. Therefore, the connector legs 122 can no longer be moved rearwardly, vertically or laterally.

Figure 9:
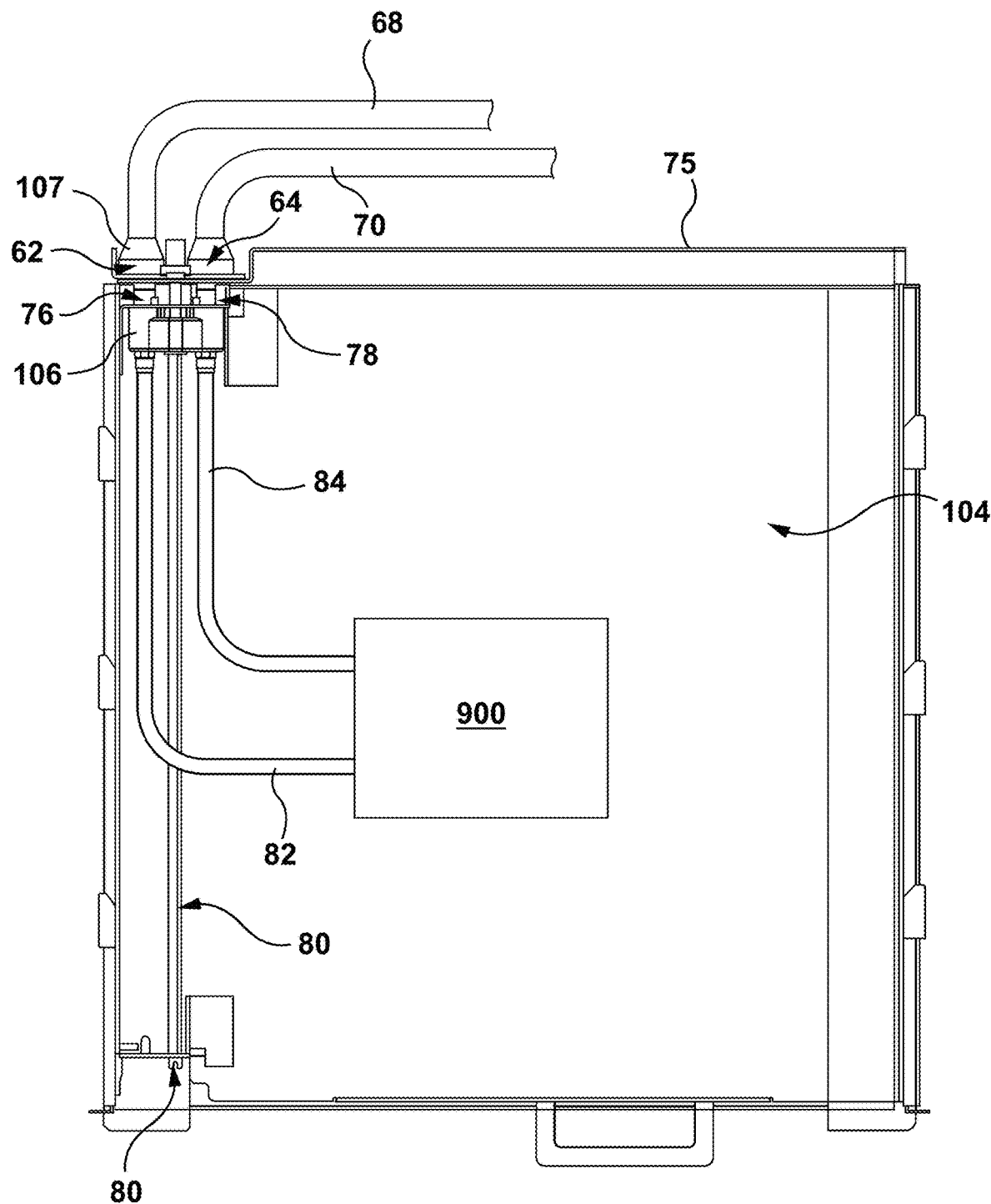
FIG. 9 is a top plan view of a component insertable in the rack of FIG. 1, the component comprising a fluidic connection for cooling purposes in accordance with an embodiment of the present technology.

Returning to the description of FIG. 5, in this embodiment, the left support member 18 also comprises a plate 190 for supporting a liquid connector 107 (FIG. 9). The plate 190 extends at an angle from a direction of insertion of the support member 18 in the rack 102. In the embodiment as shown, the plate 190 extends at a right angle from the horizontally-extending portion 111 and perpendicularly to the vertically-extending portion 118, such that it will be referred to as "upright plate" 190 below. As illustrated, the left support member 18 has a shape reminiscent of the shape of a corner brace. Configurations in which the upright plate 190 would be extending at different angles with respect to the horizontally-extending portion 111 and/or the vertically-extending portion 118 are also contemplated.

Two openings 191, 192 are defined in the upright plate 190 to host corresponding connectors of the liquid connector 107 as will be described in greater details herein further below. The upright plate 190 also defines a slot 86 proximal to the opening 191, 192. As will be described below, the slot 86 located on a given left support member 18 forms an attachment point for the liquid adaptor 107 located on a component 104 that is on the same rack stage 114 of the rack 102. As illustrated, a center of the opening 191, a center of the opening 192 and a center of the slot 86 on the same rack stage 114 generally form a triangle. The slot 86 may alternatively be positioned between the openings 191, 192.

The upright plate 190 also defines fastener openings 193 through which fasteners (e.g., bolts) may be inserted to connect the liquid connector 107 to the left support member 18.

In this embodiment, the left support member 18 further comprises a tab 160 on its front end 113. The tab 160 may be folded after mounting of the left support member 18 on the mounting panel 27 such that the tab 160 locks a position of the left support member 18 on the rack 102. As shown in FIG. 5, in its unfolded position, the tab 160 extends along the horizontally-extending portion 111. As best shown in FIG. 7, upon being inserted in a corresponding opening 205 of the left mounting panel 27, the tab 160 may be folded upwardly or downwardly (the tab 160 is folded downwardly in the illustrative embodiment of FIG. 7) to lock a position of the left support member 18 on the rack 102.

More specifically, the tab 160 is inserted in the opening 205 in its unfolded position. For example, the tab 160 or a portion thereof may be inserted on a side thereof in the opening 205 upon insertion of the connector legs 122 in the enlarged portions 210 of the apertures 200. As another example, the tab 160 may be inserted in the portion of the opening 205 extending through the front end 211 of the mounting panel 27 upon sliding of the connector legs 122 along the apertures 200 in the depth direction of the rack 102.

In this embodiment, the tab 160 is further folded such that, in its folded position, the tab 160 abuts a rear surface 21 of the vertically-extending front portion 221 of the left mounting panel 27. Therefore, the left support member 18 can no longer be moved frontwardly with respect to the rack 102.

Right Support Member 20

The right support member 20 will now be described with reference to FIG. 8. In this embodiment, the right support member 20 is mounted on a right mounting panel 27 of the rack 102.

Similarly to the left support member 18, the right support member 20 has a horizontally-extending portion 111', or "plate" extending from a front end 113' to a rear end 115' between left and right lateral ends 116', 117'. As can be seen, the right support member 20 extends in the depth direction of the rack 102 such that, in use, the front end 113' is located proximate the front end 211 of a corresponding right mounting panel 27 while the rear end 115' is located proximate the rear end 220' of the right mounting panel 27. The right support member 20 also has a vertically-extending portion 118' extending from the left lateral end 116' of the horizontally-extending portion 111' at a right angle and defining an internal side surface $118_1'$ and an external side surface $118_2'$.

In this embodiment, the right support member 20 has three connector legs 122' extending from the vertically-extending portion 118'. As described for the connector legs 122 of the left support member 18, each of the connector legs 122' of the right support member 20 is configured to engage with a respective aperture 200 of the corresponding right mounting panel 27 to connect the right support member 20 to the rack 102. In this embodiment, the connector legs 122' extend laterally from a top end 119' of the vertically-extending portion 118' and at a right angle from the vertically-extending portion 118'.

In this embodiment, the right support member 20 further comprises a tab 160' on its front end 113'. Similarly to the tab 160 of the left support member 18, the tab 160' may be folded such that, upon disposal of the right support member 20 on the right mounting panel 27, the tab 160' locks a position of the right support member 20. The right support member 20 can thus no longer be moved frontwardly with respect to the rack 102 when the tab 160' is folded against the rack 102.

In use, the electronic equipment of a given component 104 is disposed on the horizontally extending portions 111 of the corresponding left and right support members 18, 20. Optionally, in alternative embodiments, the left and right support members 18, 20 may be formed as single integral component, notably as a same metal sheet that is bent into shape to have its left and right lateral sides identical to the left and right support members 18, 20 described above.

Figure 8:
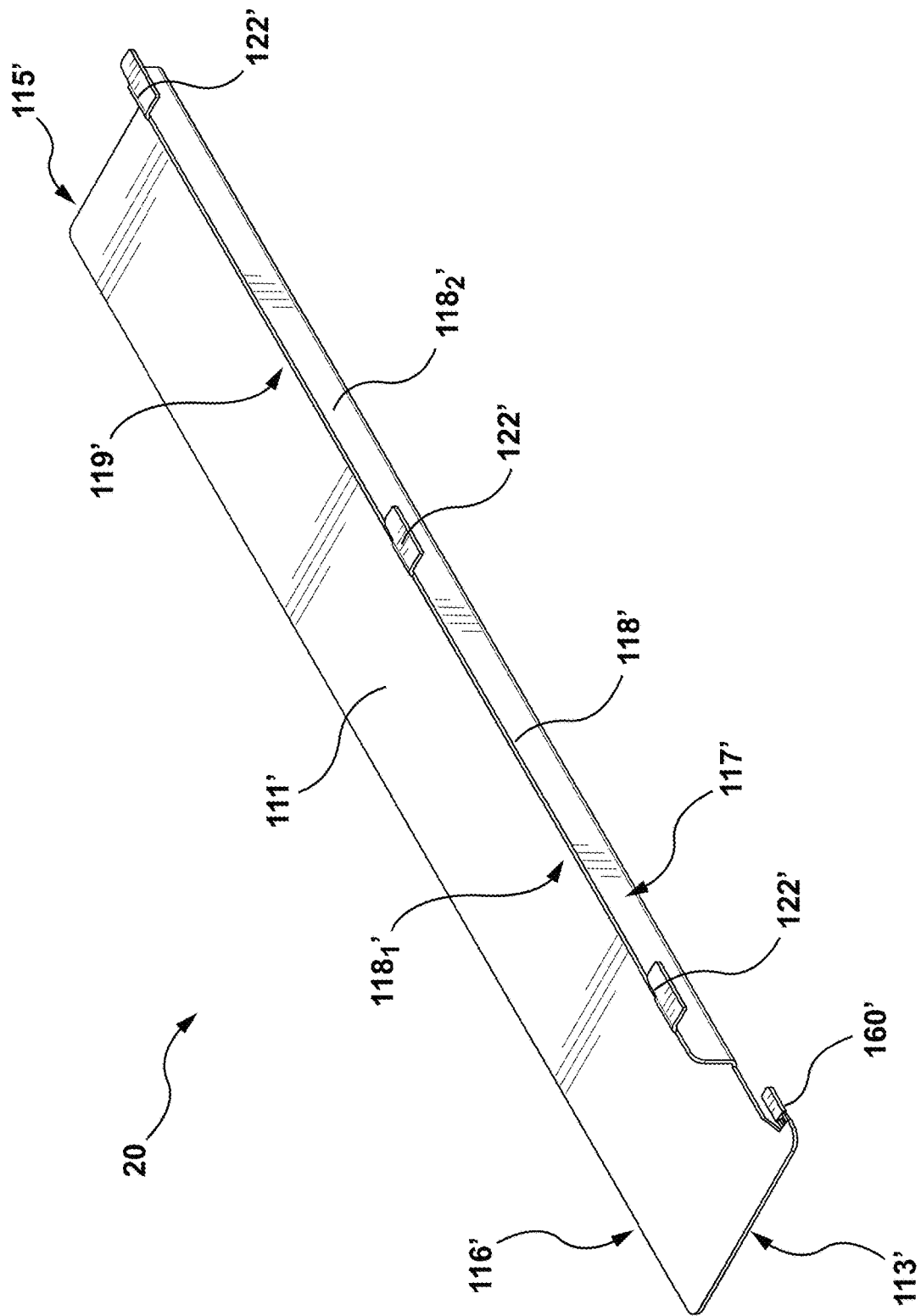
FIG. 8 is a perspective view, taken from a top, front, right side, of a right support member configured to be connected to a right mounting panel of the rack of FIG. 1 in accordance with an embodiment of the present technology.

Configurations in which the left and right support members 18, 20 would be respectively mirror images of the right and left support members 20, 18 as depicted in FIGS. 5 and 8 are also contemplated. Configurations in which the support member holding the liquid connector 107 would be the right support member are also contemplated.

Fluid Path

FIG. 9 is a top plan view of a variant of a component 104 inserted in the rack 102 of FIG. 1, the component 104 providing a fluidic connection for cooling purposes via the liquid connector 106. FIG. 9 illustrates a non-limiting embodiment in which the liquid connector 106 is connected to the fluid connector 107 mounted on the left support member 18 for providing liquid cooling to the heat-generating units 900 (only one of which is depicted in FIG. 9). The liquid connector 107 comprises a feed port 62 and a return port 64. The feed port 62 is connected to a "cold" feed tube 68 mounted behind the upright plate 190 for distributing liquid, for example water, for cooling of the heat-generating units 900. The liquid returns to the return port 64 via a "hot" return tube 70.

The liquid connector 106 is mounted on the component 104, proximally to a rear edge 75 of the component 104. The liquid connector 106 comprises an inlet port 76 and an outlet port 78. The inlet port 76 and the outlet port 78 are respectively adapted for mating with the feed port 62 and with the return port 64 when the support member 18 and the component 104 are both fully inserted in the rack 102. A "cold" inlet tube 82 is connected to the inlet port 72 and extends to a water cooling device thermally connected to the heat-generating units 900 for providing liquid cooling thereto. As an example, the heat-generating units 900 may be equipped with water blocks (not shown) for receiving the liquid such that the liquid may collect thermal energy generated by the heat-generating units 900. As such, the inlet tube 82 may be connected to an inlet of the water block. A "hot" outlet tube 84 is connected to the outlet port 74 for conducting the heated liquid from the water cooling device to the outlet port 74. When the component 104 is fully installed, cooling liquid may be injected via the feed tube 68 and reach the inlet tube 82, the liquid returning to the return tube 70 via the outlet tube 84.

It may be noted that the pair formed by the feed port 62 and the inlet port 76 is interchangeable with the pair formed by the return port 64 and the outlet port 78. In fact, the hot and cold tubes may be connected to any one of the ports as long as consistency is maintained between these connections and a cooling system (not shown) of the rack 102 for providing liquid cooling to the heat-generating units 900.

In the embodiment of FIG. 9, the liquid connector 106 also comprises a rod 80 that extends at one end between the inlet and outlet ports 76, 78 and at another end to a front of the component 104. Operation of the elongate rod 80 is described hereinbelow.

Liquid Connector 107

Figure 10:
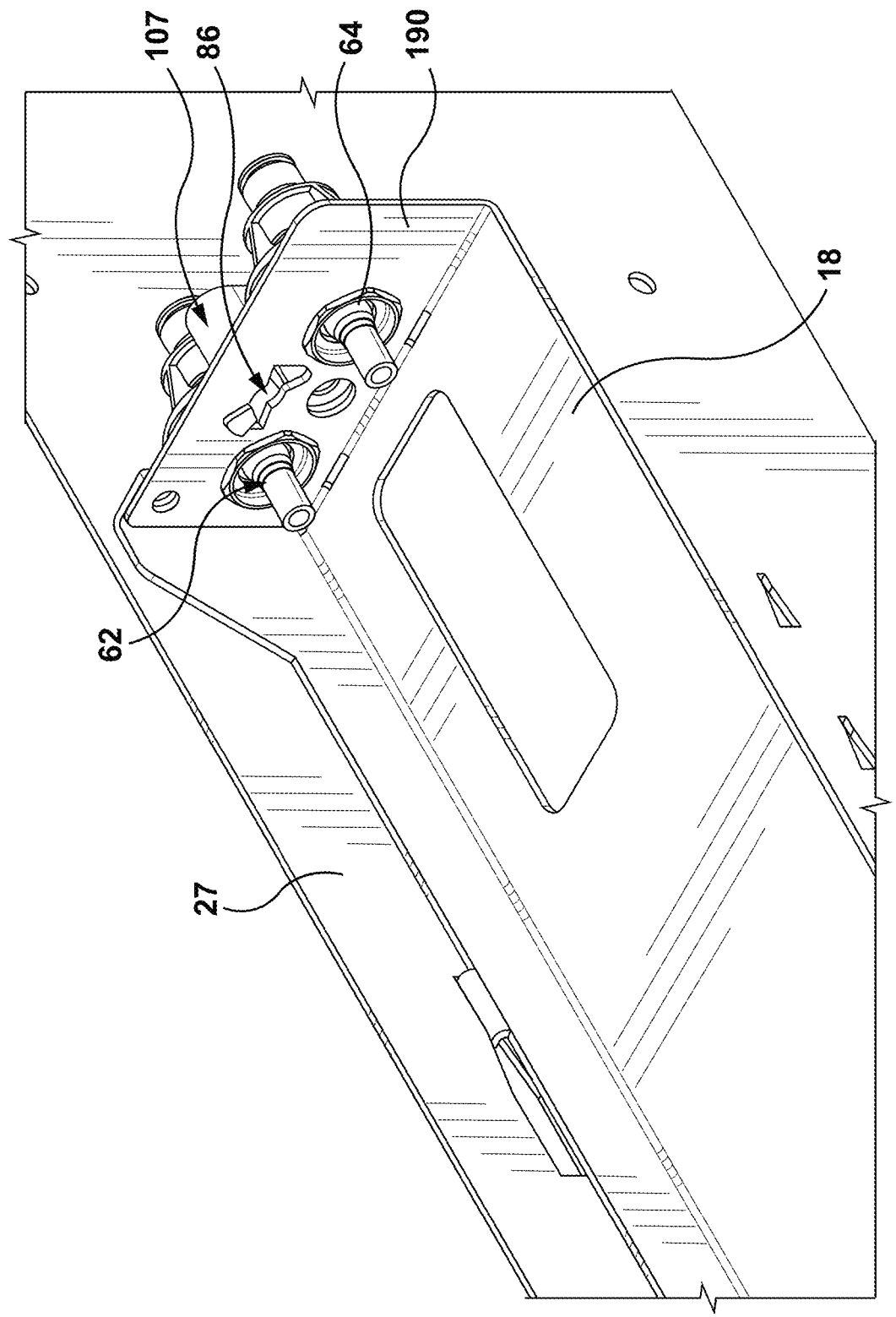
FIG. 10 is a perspective view, taken from a top, front, right side, of the left support member of FIG. 5 with a liquid connector mounted thereto, the left support member being connected to the left mounting panel of FIG. 3 in accordance with an embodiment of the present technology.

FIG. 10 illustrates the liquid connector 107 mounted on the left support member 18 according to a non-limiting embodiment of the present technology. In this particular and non-limiting embodiment, the feed and return ports 62, 64 are male connectors and the liquid connector 107 is mounted (e.g. bolted) on a rear side of the upright plate 190 such that portions of the feed and return ports 62, 64 extends frontwardly and through the corresponding openings 191, 192. The feed and return ports 62, 64 are defined in a plane parallel to the horizontally-extending portion 111 and perpendicular to the upright plate 190. Configurations in which the feed and return ports 62, 64 would be positioned vertically, one above the other, or defining an angle not parallel to a surface of the horizontally-extending portion 111, to mate with compatible ports of the liquid connector 106 are also contemplated.

Liquid Connector 106

Figure 11:
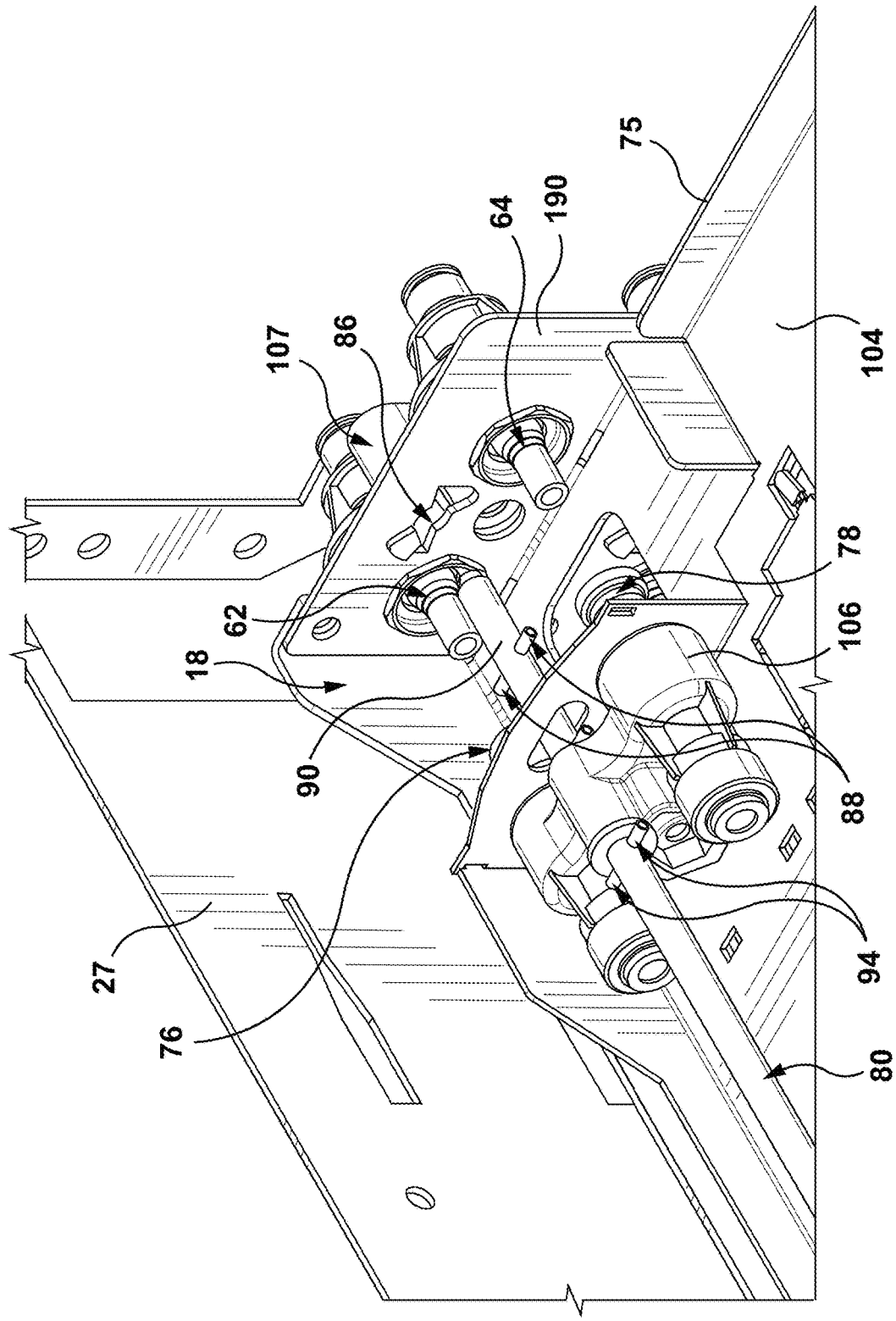
FIG. 11 is a perspective view, taken from a top, front, right side, of the component of FIG. 9 partially inserted in a rack in accordance with an embodiment of the present technology in accordance with an embodiment of the present technology.
Figure 12:
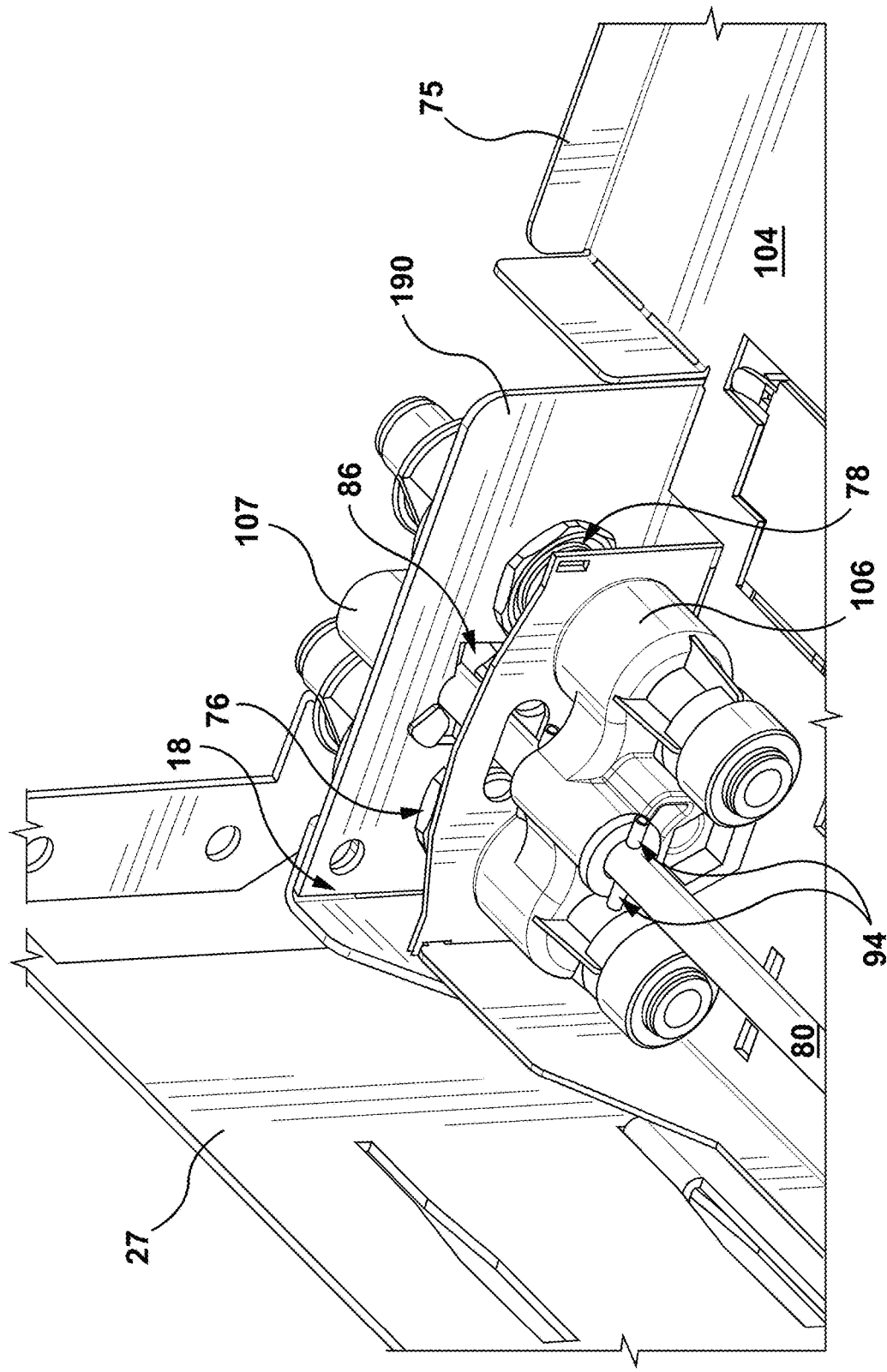
FIG. 12 is a perspective view, taken from a top, front, right side, of the component of FIG. 9 being substantially fully inserted in the rack in accordance with an embodiment of the present technology in accordance with an embodiment of the present technology.
Figure 13:
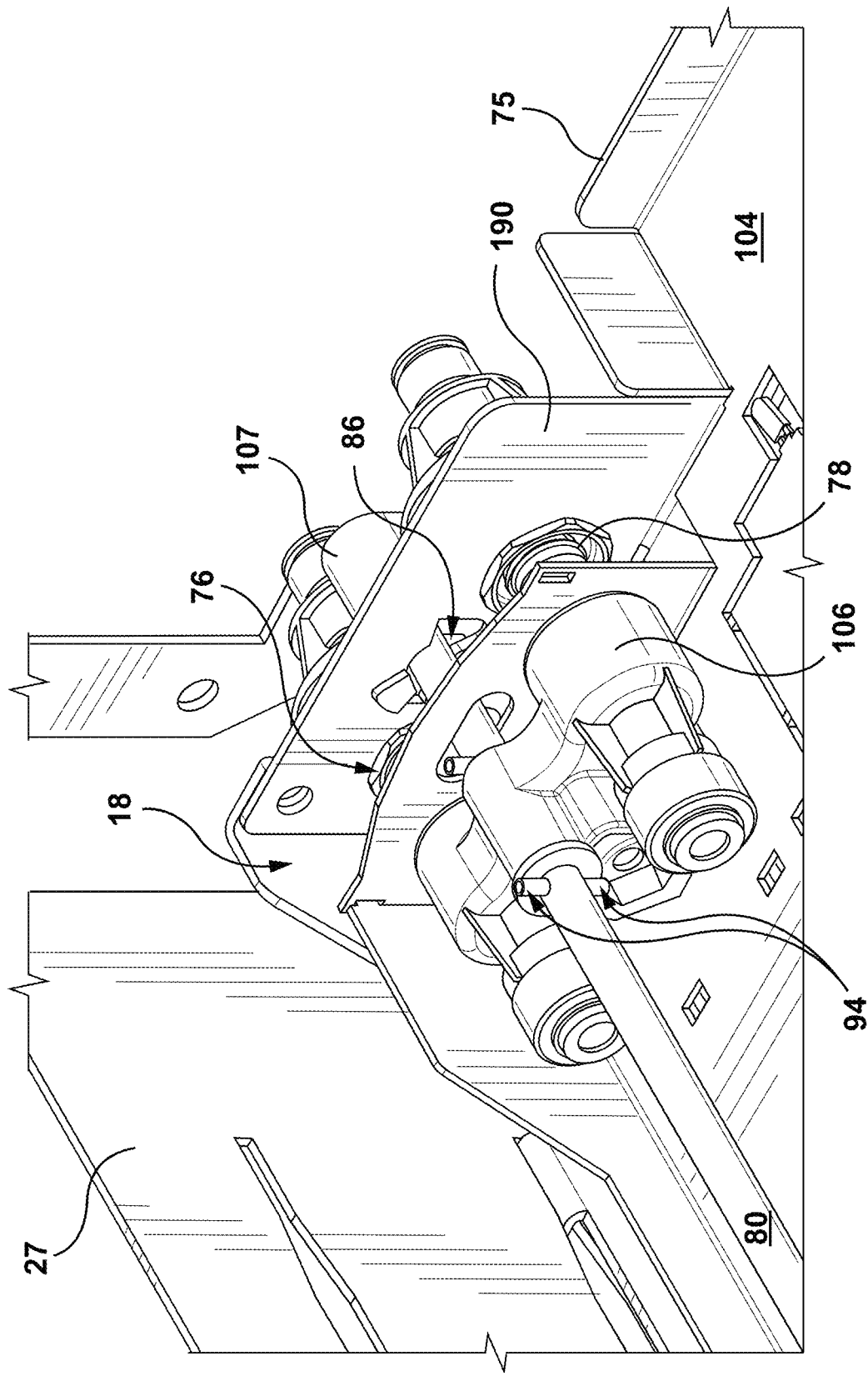
FIG. 13 is a perspective view, taken from a top, front, right side, of the component of FIG. 6 being fully inserted and locked in the rack in accordance with an embodiment of the present technology in accordance with an embodiment of the present technology.
Figure 14:
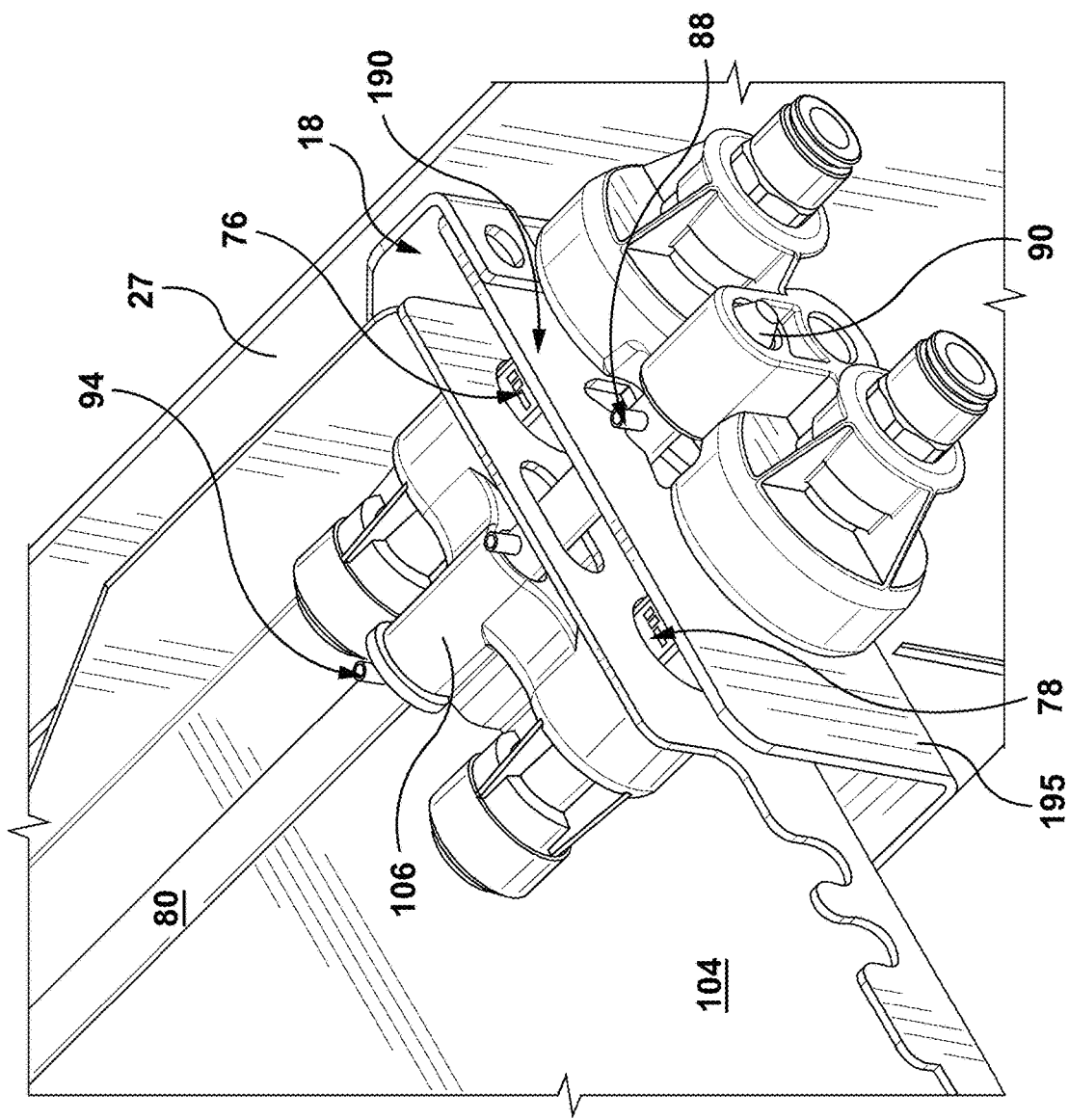
FIG. 14 is a perspective view, taken from a top, rear, right side, of the component of FIG. 6 being fully inserted and locked in the rack in accordance with an embodiment of the present technology.

FIG. 11 is a perspective, detailed view of the component 104 of FIG. 9 partially inserted in the rack 102. FIG. 12 is a perspective, detailed view of the component 104 of FIG. 9 being substantially fully inserted in the rack 102. FIG. 13 is a perspective, detailed view of the component 104 of FIG. 9 being fully inserted and locked in the rack 102. FIG. 14 is a perspective, detailed view, taken from the rear, of the component 104 of FIG. 9 being fully inserted and locked in the rack 102. The various tubes of FIG. 9 are omitted on FIGS. 11 to 14 in order to simplify the illustration. Referring at once to FIGS. 11 to 14, the feed port 62 and the return port 64 are mounted on the left support members 18 in each rack stage 114 of the rack 102.

In this particular and non-limiting embodiment, the inlet and outlet ports 76, 78 are female connectors for matching the male feed and return ports 62, 64. Configurations where the inlet and outlet ports 76, 78 are male connectors for matching female feed and return ports 62, 64 are also contemplated.

The liquid connector 106 is mounted (e.g. bolted) proximate the rear edge 75 of the component 104 such that a portion of the rod 80 extends rearwardly from the component 104. In this embodiment, the rod 80 is an elongate rod 80 extending from a front end 92 to a rear end section 90, the front end 92 being configured for receiving a rotation motion from a connectable handle, a screwdriver, or like tool (not shown). As best shown in FIG. 11, the elongate rod 80 has lateral extensions 88, such as pins, on the end section 90 of the elongate rod 80 that protrudes beyond the rear edge 75 of the component 104, the inlet port 76 and the outlet port 78.

The elongate rod 80 is rotated, for example manually, for aligning the lateral extensions 88 with the slot 86 formed in the upright plate 190 prior to full insertion of the component 104 in the rack 102, substantially as illustrated on FIG. 11. FIG. 12 shows that the end section 90 and the lateral extensions 88 have been inserted via the slot 86 within the upright plate 190. The rod 80 has not yet been rotated further from its position on FIG. 11, as evidenced by the orientation of pins 94 of the rod 80 that remains unchanged between FIGS. 11 and 12. FIGS. 13 and 14 show that the rod 80 is rotated about a quarter of a turn, as evidenced by the different orientation of the pins 94. The rotation of the rod 80 places the lateral extensions 88 out of alignment with the slot 86 after full insertion of the component 104 in the rack 102. This causes the lateral extensions 88 to abut on a rear face 195 of the upright plate 190 opposite from the component 104 to maintain the liquid connector 106 in place. There may be a slight movement of the component 104 in relation to the left support member 18 between FIGS. 12 and 13, the liquid connector 106 and the rear edge 75 of the component 104 being brought slightly closer to a rear-end of the rack 102 on FIGS. 12 and 13. This movement is caused by a pressure applied on the liquid connector 106 by the pins 94 when the lateral extensions 88 are slightly pulled inward of the upright plate 190 by the displacement of the rod 80 on the rear face 195 of the upright plate 190. This movement has at least a double effect, in which the component 104 is held firmly in place in the rack 102 while, in addition, watertight connections are established between the feed and inlet ports 62, 76 and between the return and outlet ports 64, 78. It may be noted that seals (not shown) such as for example Teflon™ or rubber rings may be provided to prevent leakage at the connections between the various ports.

In some applications, the connections of the inlet and outlet ports 76, 78 of the liquid connector 106 to the feed and return ports 62, 64 mounted on the upright plate 190 of the left support member 18 may suffice to provide proper alignment of the component 104 in the rack 102.

Method of Mounting a Component in the Rack 102

Figure 15:
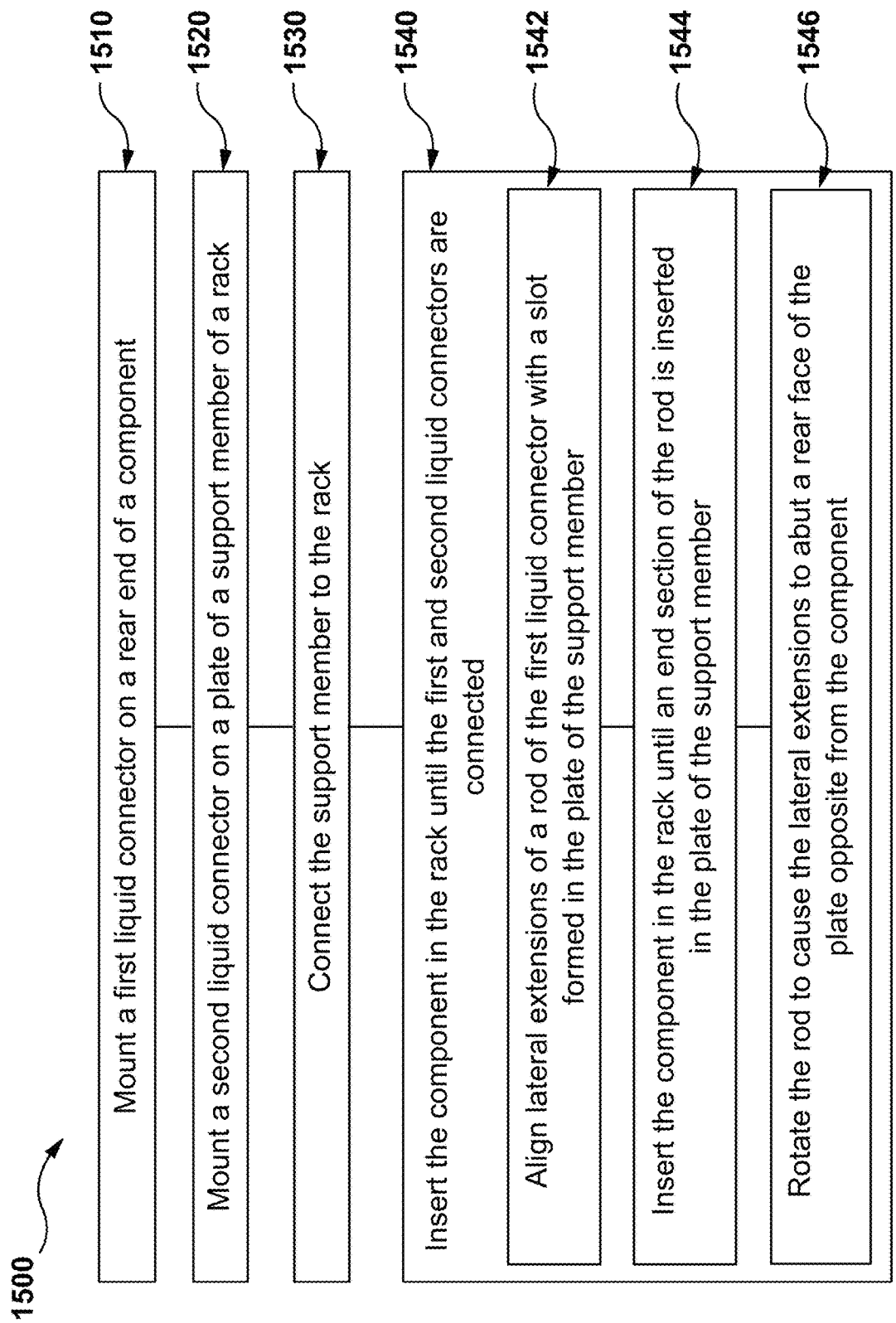
FIG. 15 is a sequence diagram of a method of mounting a component in a rack in accordance with an embodiment of the present technology.

FIG. 15 is a sequence diagram of a method of mounting a component in the rack 102. On FIG. 15, a sequence 1500 comprises a plurality of operations that may be executed in variable order, some of the operations possibly being executed concurrently, some of the operations being optional. In the sequence 1500, operation 1510 comprises mounting the liquid connector 106 on a rear end of the component 104. In this embodiment, the two inlet and outlet ports 76, 78 of the liquid connector 106 may be mounted directly on the component 104. At operation 1520, the liquid connector 107 are mounted on the left support member 18 of the rack 102. More specifically, in this embodiment, the liquid connector 107 comprises the feed and return ports 62, 64 mounted on the plate 190 of the left support member 18.

At operation 1530, the left support member 18 is mounted in the rack 102, being connected to the left mounting panel 27. More specifically, in this embodiment, the connectors legs 122 of the left support member 18 are inserted in the apertures 200 and the tab 160 may be inserted in the opening 205 of the mounting panel 27. The tab 160 may be folded to abut the rear surface 21 of the vertically-extending front portion 221 of the mounting panel 27 such that, in use, the tab 160 and the connector legs 122 lock a position of the left support member 18. In an embodiment, at this step 1530, the right support member 20 may similarly be connected to the right mounting panel 27. In this embodiment, the connectors legs 122' of the right support member 20 are inserted in the apertures 200 of the right mounting panel 27 and the tab 160' may be inserted and further folded in the opening 205 of the right mounting panel 27 such that, in use, the tab 160 and the connector legs 122 lock a position of the left support member 18. In this embodiment, the left and right support members 18, 20 are thus disposed on a same horizontal axis so as to support the component 104 upon insertion thereof in the rack 102. It is contemplated that the right support member 20 may be mounted on the right mounting panel 27 using different techniques, for example being permanently connected thereto.

At operation 1540, the component 104 is inserted in the rack 102 until the inlet and outlet ports 76, 78 are connected to the feed and return ports 62, 64 respectively. In this embodiment, the feed and return ports 62, 64 are male ports and the inlet and outlet ports 76, 78 are female ports. Therefore, in this embodiment, the feed and return ports 62, 64 are received in the inlet and outlet ports 76, 78 at operation 1540. Operation 1540 may comprise one or more of sub-operations 1542, 1544 and 1546, these sub-operations being executed when the liquid connectors 106 and 107 are used. At sub-operation 1542, the lateral extensions 88 of the rod 80 are substantially aligned with the slot 86 formed on the plate 190. At sub-operation 1544, the component 104 is inserted in the rack 102 until the end section 90 of the rod 80 is inserted in the slot 86. At sub-operation 1546, after full insertion of the component 104 in the rack 102, the rod 80 is rotated for placing the lateral extensions 88 out of alignment with the slot 86 to cause the lateral extensions to abut on the rear face 195 of the plate 190 opposite from the component 104 to maintain the component 104 inserted in the rack 102. If conventional quick-connect adaptors are used in place of the liquid connectors 106 and 107, sub-operations 1542, 1544 and 1546 are not executed. Visual and/or manual inspection may help in ensuring that the liquid connectors mounted on the component 104 and on the support member 18 are properly connected.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A system, comprising:
  a rack;
  a support member configured to be selectively inserted in the rack, the support member comprising an elongate plate extending in a direction of insertion of the support member in the rack from a front end to a rear end of the support member, and a plate at its rear end, the plate extending perpendicularly from the elongate plate, the support member further comprising a first liquid connector mounted to the plate; and
  a component configured for being supported in the rack by the support member, the component comprising a second liquid connector mounted on a rear edge of the component, the second liquid connector being configured for connecting to the first liquid connector when the support member and the component are inserted in the rack, wherein the plate comprises a slot, wherein the component comprises a rod with one or more lateral extensions, and wherein the rod is rotatable for aligning the one or more lateral extensions with the slot during insertion of the component in the rack, and for placing the one or more lateral extensions out of alignment with the slot after the component is mounted in the rack.

2. The system of claim 1, wherein:
the first liquid connector comprises a feed port and a return port mounted on the plate;
the second liquid connector comprises an inlet port and an outlet port;
the inlet port is adapted for mating with the feed port when the first and second liquid connectors are connected; and
the outlet port is adapted for mating with the return port when the first and second liquid connectors are connected.

3. The system of claim 2, further comprising:
a feed tube connected to the feed port; and
a return tube connected to the return port;
wherein the feed tube and the return tube extend behind the plate of the support member for providing liquid cooling to the component.

4. The system of claim 3, further comprising:
an inlet tube mounted to the inlet port; and
an outlet tube mounted to the outlet port;
wherein the inlet tube and the outlet tube are mounted on the component for distributing liquid cooling to a heat-generating unit of the component.

5. The system of claim 2, wherein the slot is formed between the feed port and the return port.

6. The system of claim 2, wherein a center of the feed port, a center of the return port and a center of the slot form a triangle.

7. The system of claim 1, wherein the rod extends to a front edge of the component.

8. The system of claim 1, wherein the first liquid connector is a male liquid connector and the second liquid connector is a female liquid connector.

9. The system of claim 1, wherein the first liquid connector is a female liquid connector and the second liquid connector is a male liquid connector.

10. The system of claim 1, wherein:
the rack comprises two opposite mounting panels;
the support member is a first support member configured for mounting on one of the mounting panels;
the system further comprises a second support member configured for mounting on another one of the mounting panels; and
the component is configured for being supported in the rack by the two mounting panels.

11. The system of claim 10, wherein:
each mounting panel comprises a plurality of rack mounting features distributed along a same horizontal axis, corresponding rack mounting features being disposed at corresponding heights on the two mounting panels; and
the first and second support members each comprise a plurality of connector legs configured for connecting to corresponding ones of the rack mounting features when the first and second support members are inserted in the rack.

12. The system of claim 1, wherein the support member further comprises a tab positioned on its front end, the tab being adapted for being folded against the rack for locking a position of the support member when mounted in the rack.

13. The system of claim 1, wherein the rack defines a plurality of parallel stages, each respective stage being adapted for receiving a respective support member and a respective component.

14. The system of claim 13, wherein a spacing between each of the plurality of parallel stages corresponds to a standard-size rack unit.

15. A system, comprising:
a support member configured to be selectively inserted in a rack, the support member comprising an elongate plate extending in a direction of insertion of the support member in the rack from a front end to a rear end of the support member, and a plate at its rear end, the plate extending perpendicularly from the elongate plate, the support member further comprising a first liquid connector mounted to the plate; and
a component configured for being supported in the rack by the support member, the component comprising a second liquid connector mounted on a rear edge of the component, the second liquid connector being configured for connecting to the first liquid connector when the support member and the component are inserted in the rack, wherein the plate comprises a slot, wherein the component comprises a rod with one or more lateral extensions, and wherein the rod is rotatable for aligning the one or more lateral extensions with the slot during insertion of the component in the rack, and for placing the one or more lateral extensions out of alignment with the slot after the component is mounted in the rack.

16. The system of claim 15, wherein:
the first liquid connector comprises a feed port and a return port mounted on the plate;
the second liquid connector comprises an inlet port and an outlet port;
the inlet port is adapted for mating with the feed port when the first and second liquid connectors are connected; and
the outlet port is adapted for mating with the return port when the first and second liquid connectors are connected.

17. The system of claim 16, further comprising:
a feed tube connected to the feed port; and
a return tube connected to the return port,
wherein the feed tube and the return tube extend behind the plate of the support member for providing liquid cooling to the component.

18. The system of claim 17, further comprising:
an inlet tube mounted to the inlet port; and
an outlet tube mounted to the outlet port;
wherein the inlet tube and the outlet tube are mounted on the component for distributing liquid cooling to a heat-generating unit of the component.

19. The system of claim 15, wherein the first liquid connector is a male liquid connector and the second liquid connector is a female liquid connector.

20. The system of claim 15, wherein the first liquid connector is a female liquid connector and the second liquid connector is a male liquid connector.

* * * * *